United States Patent
Morihara et al.

(10) Patent No.: US 6,487,105 B2
(45) Date of Patent: Nov. 26, 2002

(54) TEST CIRCUIT FOR SEMICONDUCTOR INTEGRATED CIRCUIT WHICH DETECTS AN ABNORMAL CONTACT RESISTANCE

(75) Inventors: Toshinori Morihara, Tokyo (JP); Hiroki Shimano, Tokyo (JP)

(73) Assignee: Mitsubishi Denki Kabushiki Kaisha, Chiyoda-ku (JP)

(*) Notice: Subject to any disclaimer, the term of this patent is extended or adjusted under 35 U.S.C. 154(b) by 7 days.

(21) Appl. No.: 09/741,998

(22) Filed: Dec. 22, 2000

(65) Prior Publication Data

US 2001/0055219 A1 Dec. 27, 2001

(30) Foreign Application Priority Data

Jun. 23, 2000 (JP) .......................................... 2000-189593

(51) Int. Cl.[7] ................................................ G11C 11/24
(52) U.S. Cl. ............................ 365/149; 365/51; 365/52; 365/63
(58) Field of Search ............................. 365/149, 51, 52, 365/63

(56) References Cited

U.S. PATENT DOCUMENTS 5,973,953 A * 10/1999 Yamashita et al. ............. 365/63
6,084,816 A * 7/2000 Okamura ................ 365/230.03
6,335,898 B2 * 1/2002 Watanabe et al. ...... 365/230.03

FOREIGN PATENT DOCUMENTS

JP            6-45553         2/1994

* cited by examiner

Primary Examiner—David Nelms
Assistant Examiner—Connie C. Yoha
(74) Attorney, Agent, or Firm—Burns, Doane, Swecker & Mathis, LLP

(57) ABSTRACT

There is provided a semiconductor integrated circuit having a multi level interconnect structure comprising: a first wiring connected to a transistor region formed in a semiconductor substrate; an interlayer dielectric formed on this topography; first and second contacts formed in the interlayer dielectric; and a second wiring connected electrically to the first wiring via the first and second contacts, this circuit further including switching means, connected to said first and second wirings respectively, for feeding a high potential and a low potential alternately.

8 Claims, 12 Drawing Sheets

| TERMINAL | SIGNAL | | | |
|---|---|---|---|---|
| A | H | L | L | L |
| A' | H | L | L | H |
| B | H | H | L | H |
| C | H | L | L | H |

TEST CIRCUIT FOR SEMICONDUCTOR INTEGRATED CIRCUIT WHICH DETECTS AN ABNORMAL CONTACT RESISTANCE

BACKGROUND OF THE INVENTION

1. Field of the Invention

The present invention relates to a semiconductor integrated circuit with a test circuit to remedy a contact failure on a cell plate in a memory cell section.

2. Description of the Prior Art

FIG. 15 is a layout schematic diagram showing a conventional semiconductor integrated circuit, and FIG. 16 is a schematic cross-section taken along a I—I line when the circuit of FIG. 15 is provided with a real device structure, and designates a DRAM hybrid system LSI. In FIGS. 15 and 16, reference numeral 10 designates a p-type semiconductor substrate; 11, 27 each designate a bit line; 12 designates an isolation region; 25 designates a p-well formed in the semiconductor substrate 10; 26 designates a transfer gate; 28a, 28b each designate a storage node; 29 designates a cell plate (hereinafter, abbreviated to as CP) on a memory cell region or MC region; 30 designates a contact constituted by titanium/tungsten (TiN/W) and the like; 31 designates an aluminum wiring; 35 designates a Vcp generation circuit which may generate a cell plate potential Vcp in response to a power supply potential Vcc from a main power supply; 51 designates a first interlayer dielectric; 52 designates a second interlayer dielectric; 53 designates a dielectric film such as silicon nitride and silicon oxide. The transfer gate 26 is typically formed with a silicide composed of a p-doped polycrystalline silicon film and a refractory metal, while the storage nodes 28a, 28b and cell plate 29 are typically formed with a p-doped polycrystalline silicon film.

Here, the storage nodes 28a, 28b are formed as a lower electrode of a capacitor on the first interlayer dielectric 51, to electrically connect with a lower transistor region. The dielectric film 53 for storing a capacitor capacitance is formed on the storage nodes 28a, 28b, and the cell plate 29 is formed on the film 53 as an upper electrode of the capacitor. The aluminum wiring 31 externally connected is connected with the cell plate 29 via the contact 30 formed in the second interlayer dielectric 52. The vcp generation circuit 35 is connected to the aluminum wiring 31, and feeds a power supply to the cell plate 29 so that it may be maintained at the cell plate potential Vcp, while the bit line 27 is connected to a p-rich region or p+ region in the semiconductor substrate 10, and serves a fixation of the potential of the p-well.

FIG. 16 illustrates a structure assigned by 2 bits in a DRAM memory cell, and this structure serves as 1 bit by one pair of a transistor and a capacitor. Typically, a DRAM memory cell array is composed of a transistor and a capacitor, and the cell plate 29 as an upper electrode of the capacitor and the storage nodes 28a, 28b as lower electrodes thereof forms a stacked capacitor via the dielectric film 53 such as silicon nitride and silicon oxide to be inserted between the lower and upper electrodes. The structure of the stacked capacitor is specifically disclosed in JP-A 6-45553 and the like. The cell plate 29 is disposed to cover a memory cell block, and is typically connected with the upper aluminum wiring 31, which is connected with the main power supply (Vcc), via the contact 30 to be put under the potential fixation of the cell plate potential Vcp (=Vcc/2).

The operation will be next described.

The power supply potential Vcc is fed to the Vcp generation circuit 35 from the main power supply, and the cell plate potential Vcp generated herein is fed to the aluminum wiring 31 through the node CP. In addition, as described in FIG. 16, the cell plate potential Vcp is fed to the cell plate 29 via the contact 30, and a desired electric charge is stored in the capacitor constructed with the dielectric film between the storage nodes 28a, 28b. FIG. 16 illustrates a structure in which 2 bits are stored as storage information.

Since the conventional semiconductor integrated circuit is constituted as described above, in a DRAM hybrid system LSI with high integration developments of the circuit, it is required to reduce an annealing or thermal treatment which may be applied to such a device. This makes it difficult to manage the formations of fine patterns and holes and the electric characteristics of wiring resistances, contact resistances, and the like. In particular, the cell plate 29 of the CP electrode typically is formed with p-doped polycrystalline silicone, which makes it difficult to establish an ohmic characteristic of TiN/W adapted to the contact 30 section.

Further, it is also foreseen to cause a non-ohmic characteristic because of distributions in wafer processes. It is required to remedy such an electric characteristic failure by a test after completion of the wafer processes.

SUMMARY OF THE INVENTION

The present invention is implemented to solve the foregoing problems. It is therefor an object of the present invention to provide a semiconductor integrated circuit with a test circuit in which a circuit mounted on a semiconductor chip detects an abnormal contact resistance portion and then applies to this portion, thus recovering an ohmic characteristic of the corresponding contact portion, resulting in remedying a defective chip.

According to a first aspect of the present invention, there is provided a semiconductor integrated circuit comprising: a memory cell including a field effect transistor formed in a semiconductor substrate, and a capacitor having a storage node connected to the source and a cell plate formed on the storage node via a dielectric film; a first wiring including the cell plate; a first power supply for feeding a first potential so as to maintain in a predetermined potential the cell plate of the capacitor; a second wiring having a first node and a second node connected to the first power supply; a first contact connected to the first wiring; a second contact connected to the first and second nodes; a logic circuit which may input a control signal externally at its first input and which connects its second input to the second input; a first switching circuit for selecting the first power supply or a second power supply for feeding a second potential higher than the first potential of the first power supply in response to an output after calculation in the logic circuit to feed either of the first and second potentials to the first node; a second switching circuit for selecting the first power supply or a third power supply for feeding a third potential lower than the first potential of the first power supply in response to an output after calculation in the logic circuit to feed either of the first and third potentials to the second node; and a third switching circuit for selecting a fourth power supply for feeding a fourth potential lower than the third potential, or a fifth power supply for feeding a fifth potential higher than the fourth potential and lower than the second potential in response to an output after calculation in the logic circuit to feed either of the fourth and fifth potentials to the semiconductor substrate associated with of the memory cell.

Here, the second and third potentials may be alternately applied to the first and second nodes of the second wiring.

In addition, a current limitation circuit may be connected to a wiring on the side of a third power supply of the second switching circuit, and an output from the current limitation circuit may be connected to the second input of the logic circuit.

In addition, the current limitation circuit may include a current mirror circuit and based on a wiring potential on the side of the third power supply of the second switching circuit, a main power supply for feeding a power supply potential or the third power supply for feeding the third potential may be selected to feed either of the power supply potential and the third potential to the second input of the logic circuit.

Further, a load may be connected to a wiring on the side of the main power supply, and the power supply potential may be fed to the second input of the logic circuit via the load.

Further, the logic circuit may serve as a control circuit for limiting the second and third potentials, which is fed to the cell plate constituting the capacitor, in response to a control signal.

According to a second aspect of the present invention, there is provided a semiconductor integrated circuit having a multi level interconnect structure comprising: a first wiring connected to a transistor region formed in a semiconductor substrate; an interlayer dielectric formed on this topography; first and second contacts formed in the interlayer dielectric; and a second wiring connected electrically to the first wiring via the first and second contacts, the circuit further including switching means, connected to the first and second wirings respectively, for feeding a high potential and a low potential alternately.

Here, the switching means may be connected to a transistor region of the semiconductor substrate, and feed the high and low potentials alternately.

DETAILED DESCRIPTION OF THE PREFERRED EMBODIMENTS

An embodiment of the present invention will be described below.

Embodiment 1.

Figure 1:
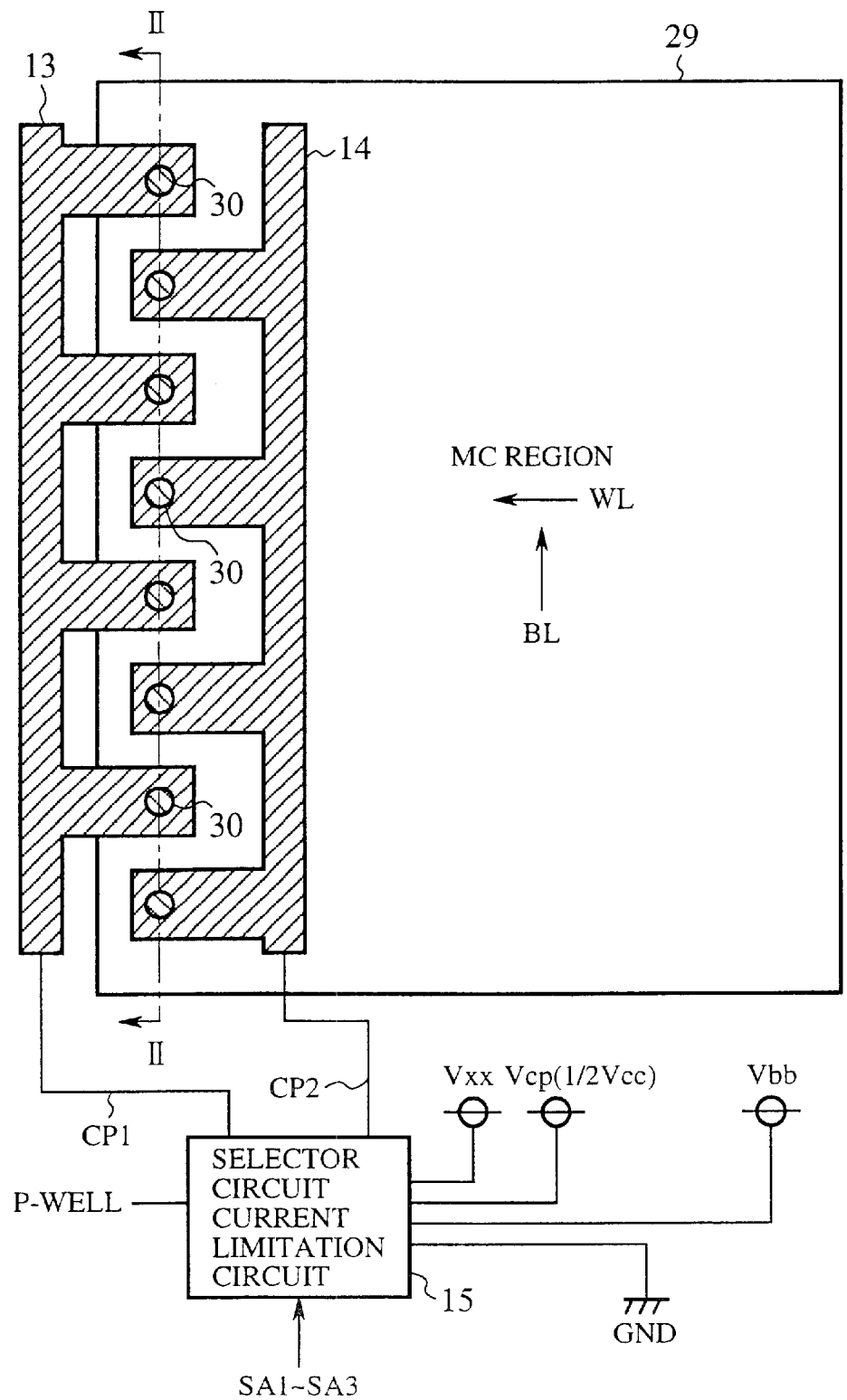
FIG. 1 is a layout schematic diagram of a semiconductor integrated circuit in accordance with an embodiment 1 of the present invention.
Figure 2:
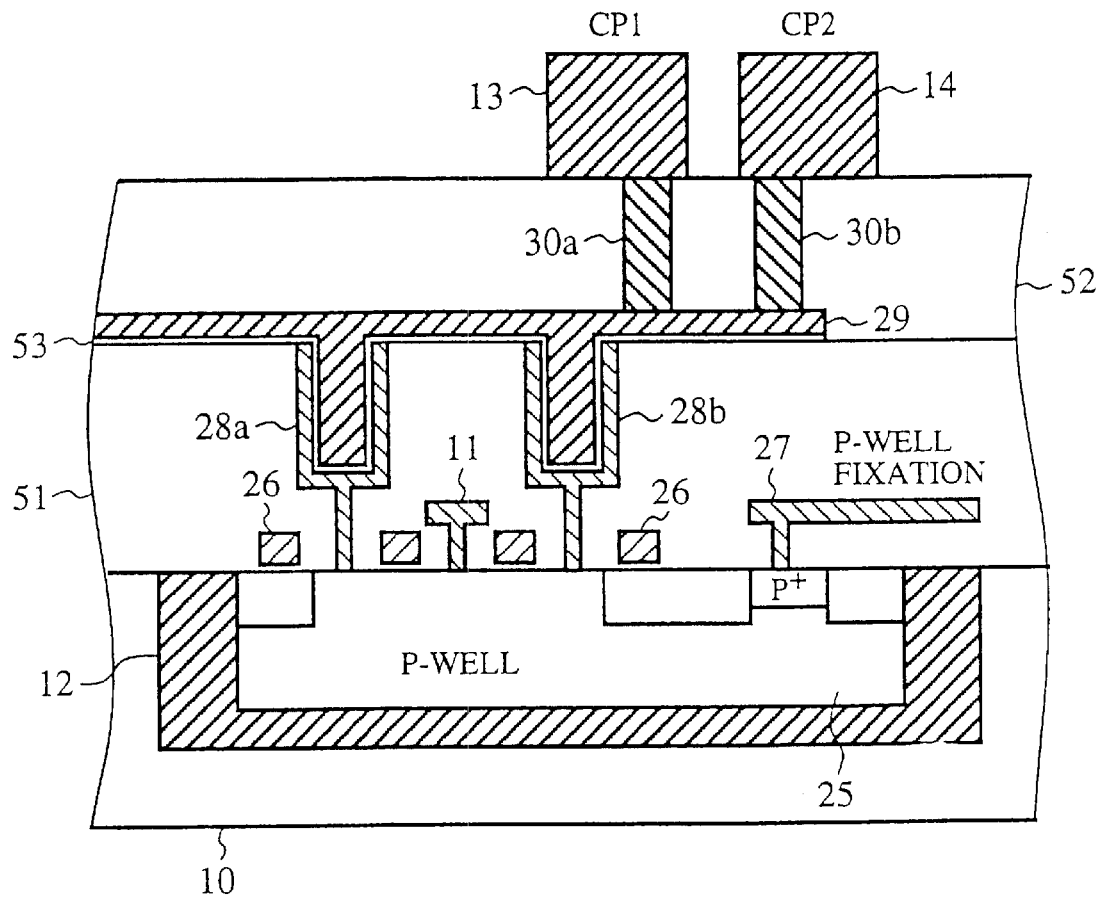
FIG. 2 is a schematic cross-section taken along a II—II line on a real device configuration having the circuit of FIG. 1.

FIG. 1 is a layout schematic diagram of a semiconductor integrated circuit in accordance with an embodiment 1 of the present invention, and FIG. 2 is a schematic cross-section taken along a II—II line when the circuit of FIG. 1 is provided with a real device structure, which designates a DRAM hybrid system LSI. In FIGS. 1 and 2, reference numeral 10 designates a p-type semiconductor substrate; 11 designates a bit line; 12 designates an isolation region; 13 designates an aluminum wiring (second wiring) connected with a node CP1; 14 designates an aluminum wiring (second wiring) connected with a node CP2; 15 designates a selector circuit or current limitation circuit (first to third switching circuits, switching means); 25 designates a p-well formed in the semiconductor substrate 10; 26 designates a transfer gate; 27 designates a bit line for fixing a potential of the p-well; 28a, 28b each designate a storage node; 29 designates a cell plate (CP) (first wiring) on a memory cell region or MC region; 30a, 30b each designate a contact (first contact, second contact); 51 designates a first interlayer dielectric; 52 designates a second interlayer dielectric (interlayer dielectric); 53 designates a dielectric film such as silicon nitride and silicon oxide. The transfer gate 26 is typically composed of a p-doped polycrystalline silicon and a silicide with a refractory metal, while the storage nodes 28a, 28b and cell plate 29 are typically composed of a p-doped polycrystalline silicon.

Here, the storage nodes 28a, 28b are formed as a lower electrode of a capacitor on the first interlayer dielectric 51 to be connected with a lower transistor region. The dielectric film 53 for storing a capacitor capacitance is formed on the storage nodes 28a, 28b. Further, the cell plate 29 serving as an upper electrode of the capacitor is formed thereon. The aluminum wirings 13, 14 are connected with the cell plate 29 externally connected via the contacts 30a, 30b formed in the second interlayer dielectric 52. The selector circuit or current limitation circuit 15 is connected to the aluminum wirings 13, 14. A Vcp power supply for maintaining the cell plate in a cell plate potential Vcp, Vxx and GND power supplies for feeding overvoltages, and a Vbb power supply for substrate bias can be feed-switched through the circuit 15. The bit line 27 is connected to a p rich region or p+ region of the semiconductor substrate 10 to perform the potential fixation of the p-well.

Vcp denotes a cell plate potential (first potential) and corresponds to one-half (=1/2Vcc) of a power supply potential (Vcc) to be fed from the main power supply, Vxx denotes an overvoltage (second potential, high potential) applied for CP contact failures, GND also denotes an overvoltage (third potential, low potential) applied for CP contact failures, Vbb denotes a substrate bias (fourth potential)

lower than GND level, to be applied to the p-well, and 1/2Vxx (See FIG. 8) denotes a high bias (fifth potential) applied to the p-well as well.

Figure 3:
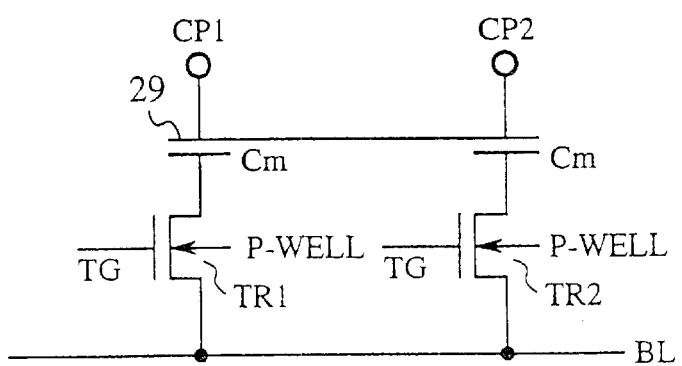
FIG. 3 is an equivalent circuit diagram assigned by 2 bits in a DRAM memory cell region on normal conditions.
Figure 4:
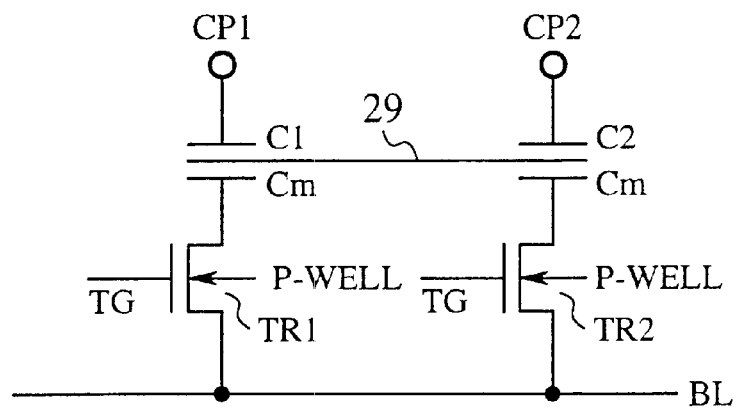
FIG. 4 is an equivalent circuit diagram assigned by 2 bits in the DRAM memory cell region on abnormal conditions.

FIG. 3 is an equivalent circuit diagram assigned by 2 bits in a DRAM memory cell region on normal conditions, while FIG. 4 is an equivalent circuit diagram assigned by 2 bits in the DRAM memory cell region on abnormal conditions. In FIGS. 3 and/or 4, C1 and C2 each denote a parasitic capacitor capacitance which may be caused by occurrence of the contact failure of the cell plate CP; Cm denotes a capacitor capacitance of a memory cell; and TR1 and TR2 each denote a transistor which serves as 1 bit with coupling a capacitor capacitance. As is apparent from the comparison of FIG. 3 and FIG. 4, on the abnormal conditions the general capacitance is increased by the parasitic capacitor capacitance of C1 and C2 in addition to the capacitance Cm. general capacitance is increased by the parasitic capacitor capacitance of C1 and C2 in addition to the capacitance Cm.

Figure 5:
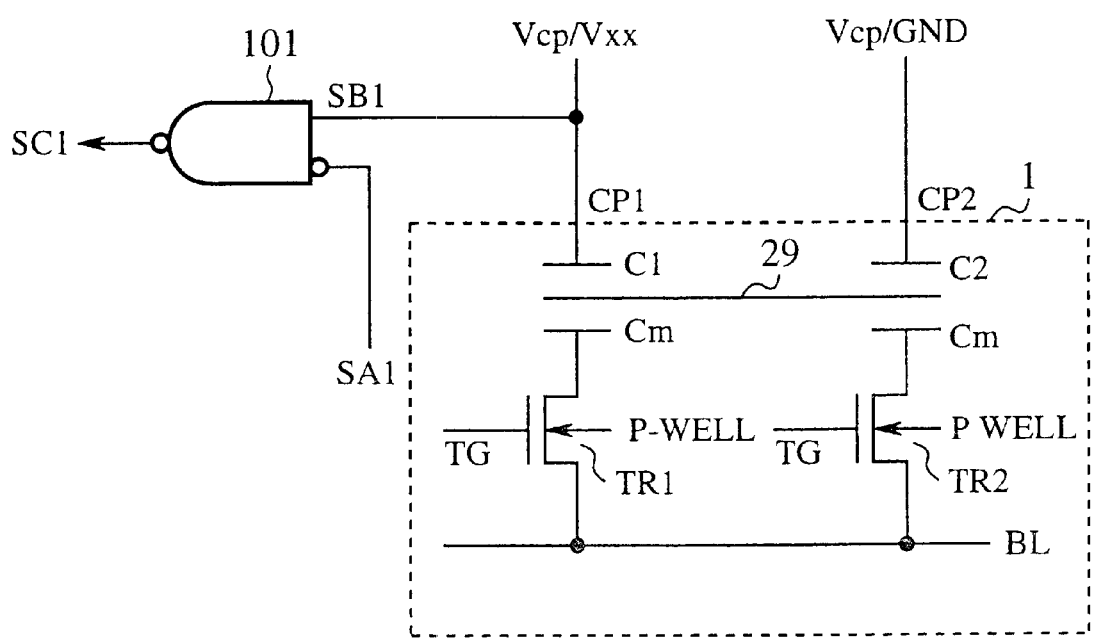
FIG. 5 is a circuit diagram showing a semiconductor integrated circuit in accordance with an embodiment 1 of the present invention.

FIG. 5 is a circuit diagram showing a semiconductor integrated circuit in accordance with the embodiment 1 of the present invention. In FIG. 5, reference numeral 1 designates an equivalent circuit of a DRAM memory cell portion on abnormal conditions; SA1 denotes an external control signal; SB1 and SC1 each denote an internal control signal; 101 designates a NAND-type logic circuit having inputs of the signal SA1 and an node CP1. On normal operations, the cell plate potential Vcp is applied to the nodes CP1, CP2, while the substrate bias (Vbb) is applied to the p-well of the memory cell region.

The internal control signal SC1, a signal output from the logic circuit 101, is an input signal to switching circuits in FIGS. 6 to 8 (described later), and in the equivalent circuit 1 of the memory cell on the abnormal conditions, the node CP1 is input from a Vcp-Vxx switching circuit, while the node CP2 is input from a Vcp-GND switching circuit.

Figure 6:
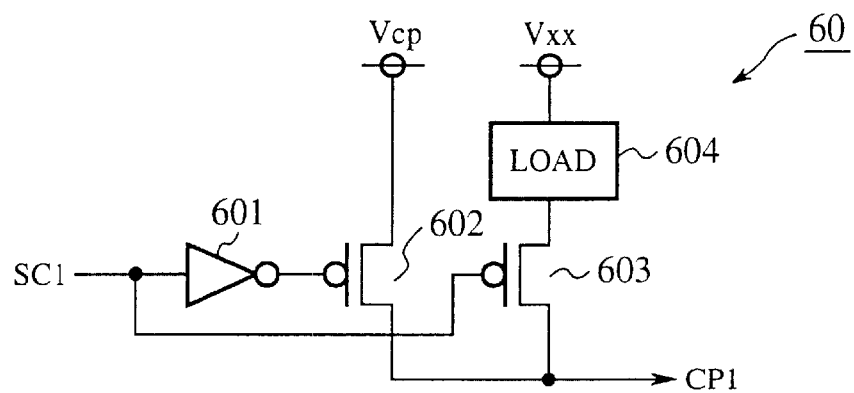
FIG. 6 illustrate a Vcp-Vxx switching circuit of the node CP1.
Figure 7:
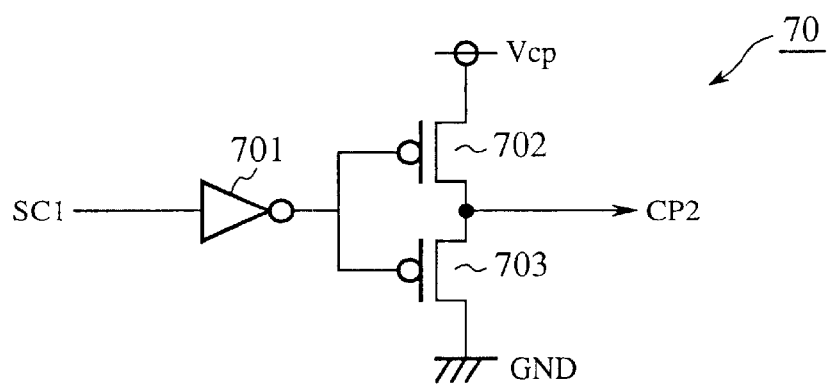
FIG. 7 illustrates a Vcp-GND switching circuit of the node CP2.
Figure 8:
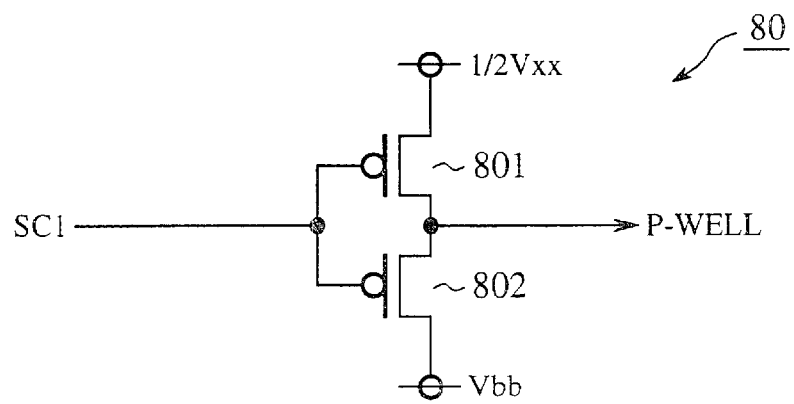
FIG. 8 illustrates a 1/2 Vxx-Vbb switching circuit of the p-well.

FIG. 6 illustrate a Vcp-Vxx switching circuit (first switching circuit) of the node CP1, FIG. 7 illustrates a Vcp-GND switching circuit (second switching circuit) of the node CP2, and FIG. 8 illustrates a 1/2Vxx-Vbb switching circuit (third switching circuit) of the p-well. In FIGS. 6 to 8, reference numerals 60, 70 and 80 each illustrate a switching circuit; 601 and 701 each designate an inverter; 602, 603, 702 and 801 each designate a PMOS transistor; 703 and 802 each designate an NMOS transistor; and 604 designates a load having a certain resistance value. These switching circuits each switch in response to the signal SC1.

Figure 9:
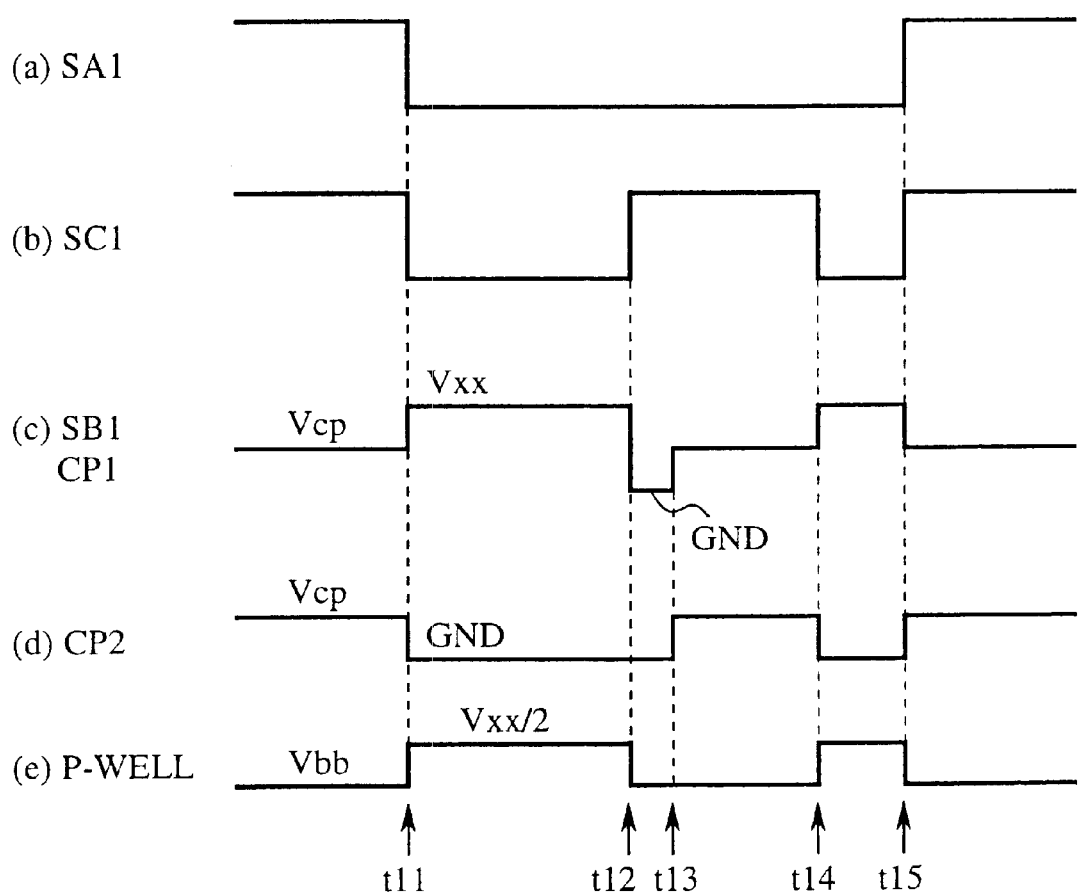
FIG. 9 illustrates timing charts showing signal wave forms in the semiconductor integrated circuit shown in FIG. 5.

FIG. 9 illustrates timing charts showing signal wave forms in the semiconductor integrated circuit shown in FIG. 5: (a) and (b) denote signal changes of the signals SA1 and SC1, respectively; (c) denote signal and potential changes of the signal SB1 and the node CP1, respectively; and (d) and (e) denote potential changes of the node CP2 and p-well, respectively.

The operation will be next described.

When the external control signal SA1 changes from H level to L level in the trailing edge of a time t11, a test mode for remedying CP contact faults starts. Then, the internal control signal SC1 also changes from H level to L level at the time t11, the internal control signal SB1 and node CP1 change from Vcp to Vxx via the switching circuit 60 in FIG. 6, and the node CP2 change from Vcp to GND via the switching circuit 70 in FIG. 7. In such a way, the overvoltage Vxx and GND are applied to the nodes CP1 and CP2, alternately. These overvoltage applications effect the electrical breakdown of parasitic capacitors C1 and C2 caused by the CP contact faults, and thereby the contacts 30a and 30b may be brought into a desired ohmic characteristic.

On the other hand, the p-well changes from the substrate bias Vbb to the high bias Vxx/2 via the switching circuit 80 at the time t11, and thereafter when the CP contact is remedied to be normal, the voltage to be applied between the cell plate (CP) and storage node (SN) may be reduced. In such a way, the breakdown of the dielectric film 53 between the storage nodes 28a, 28b and cell plate 29 may be prevented.

When the parasitic capacitors C1 and C2 is brought to the breakdown at a time t12, and the node CP1 goes down from Vxx to GND level (see FIG. 9(c)). Simultaneously, the internal control signal SC1 changes from L level to H level, and thereafter the internal control signal SB1 and nodes CP1 and CP2 change from GND to Vcp at a time t13.

The aforementioned operations will be repeated till the external control signal SA1 switches from L level to H level.

As described above, according to the embodiment 1, when the potentials of the node CP1, node CP2 and p-well are switched via the switching circuits 60, 70 and 80, respectively, in response to the external control signal SA1, an abnormal contact resistance portion may be detected, while an overvoltage may be applied to the portion. Consequently, this enables to perform the breakdown of the parasitic capacitors C1 and C2 of a failed CP contact with preventing the breakdown of the dielectric film 53 of the capacitor. Thus, such an electrical characteristic fault of the CP contact, caused in wafer processes, are recovered in an ohmic characteristic by a test after completion of the processes, thereby remedying a defective chip.

Embodiment 2

Figure 10A:
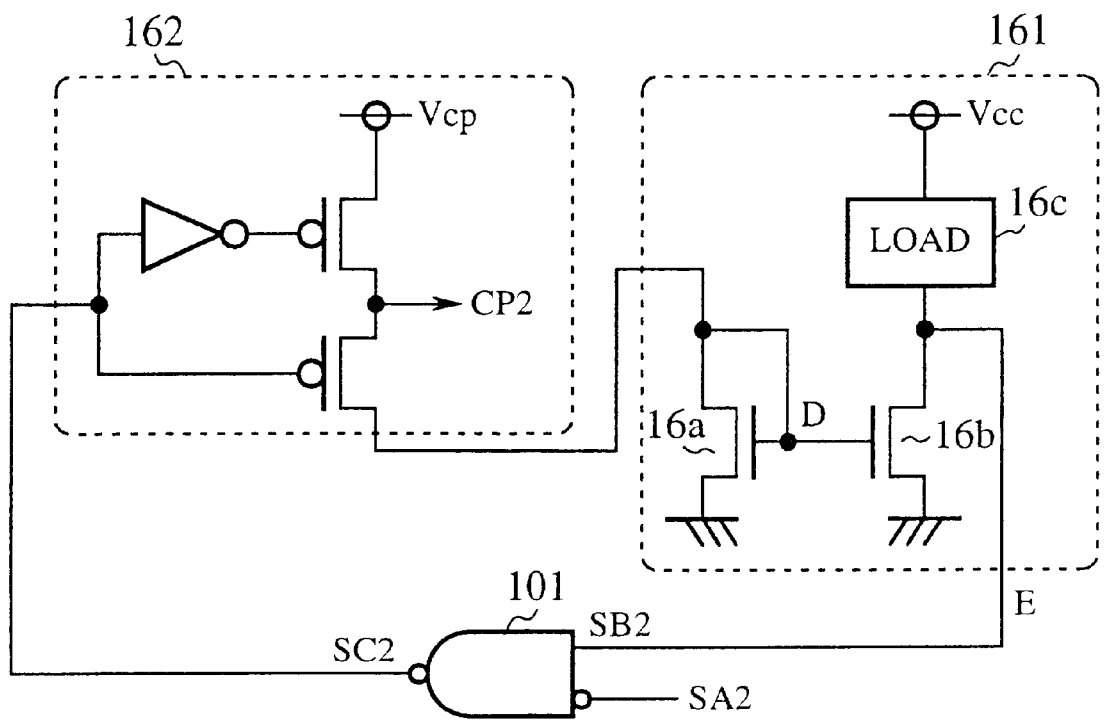
FIG. 10 is a circuit diagram showing a semiconductor integrated circuit in accordance with an embodiment 2 of the present invention.
Figure 10B:
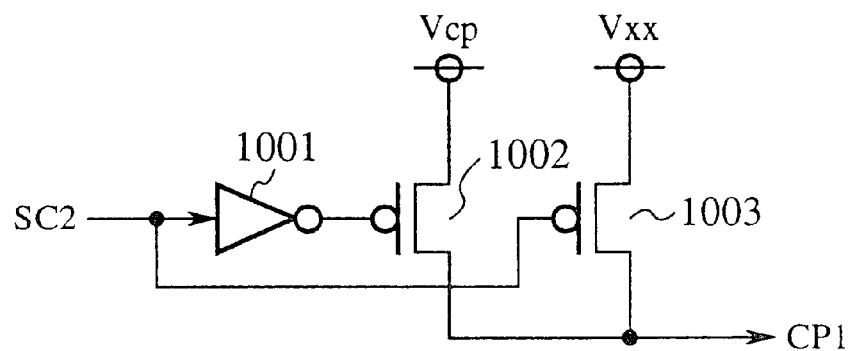

FIG. 10A is a circuit diagram illustrating a semiconductor integrated circuit in accordance with an embodiment 2 of the present invention, and FIG. 10B illustrates a Vcp-Vxx switching circuit of a node CP1 in response to an internal control signal SC2. In FIGS. 10A and 10B, reference numerals 16a and 16b each designate a transistor constructing a current mirror circuit; 16c designates a load; 161 designates a current limitation circuit; 162 designates a switching circuit for executing a connection switching of the power supply potential Vcp and current limitation circuit 161 to the transistor 16a based on the output from a logic circuit, and node CP2 thereof is connected to a connection terminal of the node CP2 on abnormal conditions in FIG. 4; 1001 designates an inverter; and 1002 and 1003 each designate a PMOS transistor.

Figure 11:
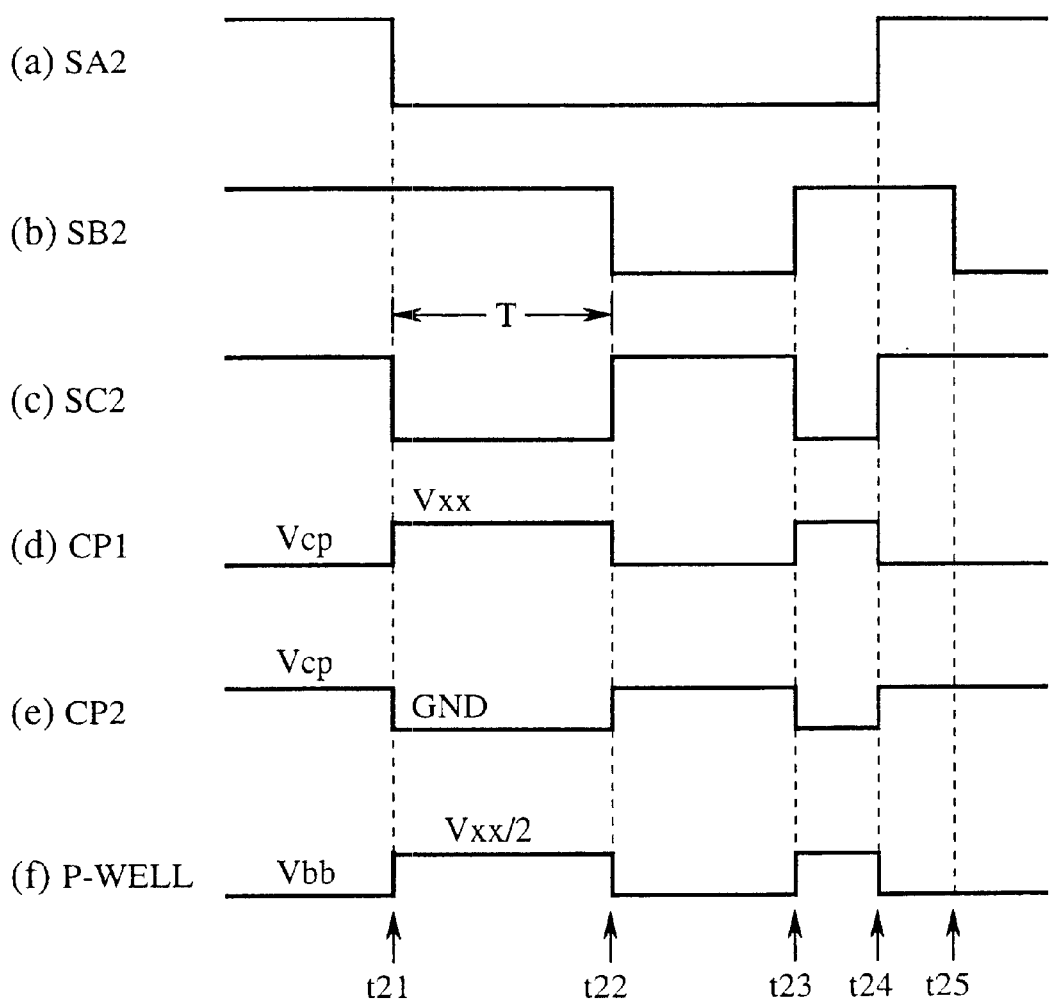
FIG. 11 illustrates timing charts showing signal wave forms in the semiconductor integrated circuit shown in FIG. 10.

FIG. 11 illustrates timing charts showing signal wave forms in the semiconductor integrated circuit shown in FIGS. 10A and 10B: (a), (b), and (c) denote signal changes of the signals SA2, SB2, and SC2, respectively; and similarly, (d), (e), and (f) denote signal changes of the node CP1, node CP2, and p-well, respectively. Here, the internal control signal SB2 corresponds to terminal D, which should be maintained at H level till a current to be flown from the node CP2 to GND exceeds one threshold value.

The operation will be next described.

The external control signal SA2 changes from H level to L level at a time t21, and a test mode starts so as to remedy CP contact faults. When the internal control signal SB2 is put in a state of H level (T period of time), the internal control signal SC2 also changes the potential from H level to L level. In such a way, the node CP1 changes the potential from Vcp to Vxx via the switching circuit 60 of FIG. 6, while the node CP2 is connected by a switching operation from Vcp to GND via the switching circuit 70 of FIG. 7 to change the potential. As a result, overvoltages Vxx and GND are applied between the node CP1 and node CP2 alternately. The overvoltages produce the breakdown of the parasitic capacitors C1 and C2 occurring in the failed CP contact as shown in FIG. 5, thereby effecting a predetermined ohmic contact characteristic for the CP contact.

On the other hand, when the p-well changes from Vbb of the substrate bias to Vxx/2 of the high bias at the time t21, and thereafter the CP contact is remedied and comes to be normal, a voltage to be applied between the cell plate (CP) and storage node (SN) can be reduced. In such a way, the breakdown of the dielectric film 53 between the storage nodes 28a, 28b and cell plate 29 may be prevented.

The breakdowns of the parasitic capacitors C1 and C2 allows an electric current Ia to flow in the transistor 16a of FIG. 10 which is connected to the node CP2, and a current flows from a main power supply (Vcc) to the load 16c in a current mirror circuit of the current limitation circuit 161. Thus, a size ratio between the transistors 16a and 16b and a resistance value of the load 16c are appropriately adjusted, the output E of the current limitation circuit 161 or the internal control signal SB2 may be set to change from H level to L level when the current value exceeds a desired threshold value.

In response to this, when the internal control signal SC2 changes from L level to H level at a time t22, and the node CP1 and node CP2 switch the connections to the cell plate potential Vcp, and the p-well switches the connection to the substrate bias Vbb, the feeding of the overvoltage applied between the node CP1 and node CP2 is stopped to limit the current flow, thereby protecting from the breakdown of the dielectric film 53 of the capacitor.

The aforementioned operations will be repeated till the external control signal SA2 switches from L level to H level thoroughly.

As described above, according to the embodiment 2, the switching circuit 162 of the current limitation circuit 161 with the Vcp connected to the node CP2 detects a current, which flows on remedying of the failed CP contact, in the current mirror circuit, and brings the output E, i.e. the input SB2 of the logic circuit 101 from H level to L level, thereby limiting a current that could flow in the test mode, for example, a failed contact through current. This may remedy defective chips and prevent the breakdown of the capacitor dielectric film 5 caused by inadvertent current feeding.

Embodiment 3

Figure 12:
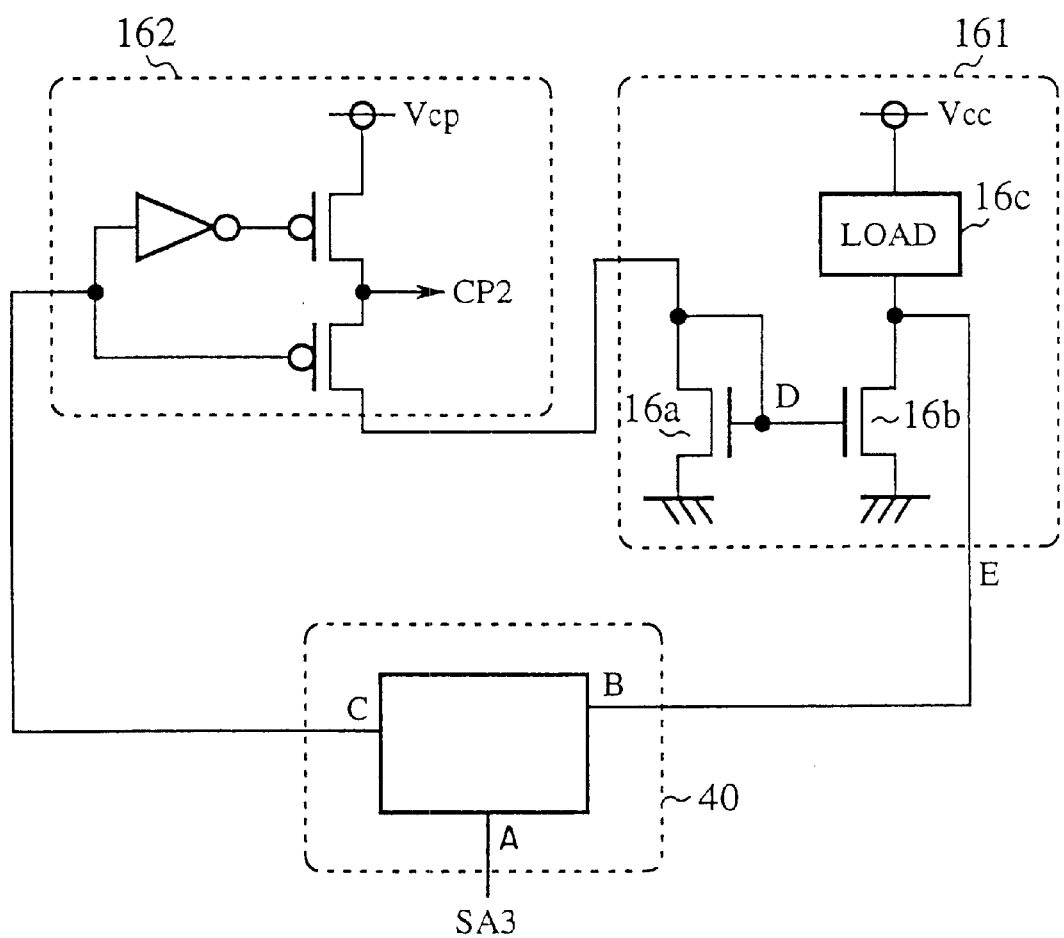
FIG. 12 is a circuit diagram showing a semiconductor integrated circuit in accordance with an embodiment 3 of the present invention.

FIG. 12 is a circuit diagram showing an integrated circuit in accordance with an embodiment 3 of the present invention. In FIG. 12, reference numeral 161 designates a current limitation circuit; 162 designates a switching circuit for switching Vcp to be fed between a node CP2 and a transistor 16a; 40 designates a control circuit, having input A for receiving external control signal SA3 and input B for receiving output E of the current limitation circuit 161, for limiting the feeding of an overvoltage by performing a feedback to the switching circuit 162 through output C. The same reference numerals above denote the same components or corresponding parts and these explanations will be omitted.

Figure 13:
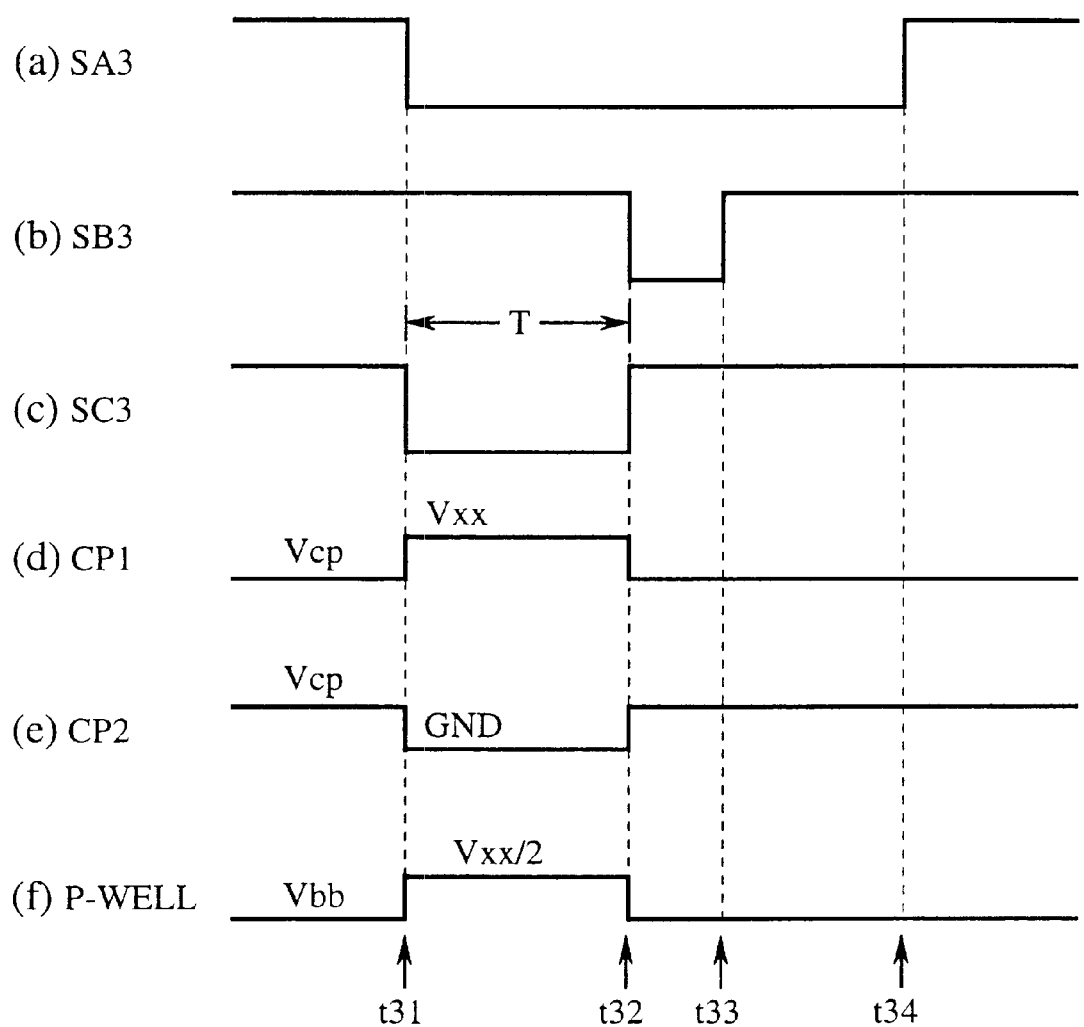
FIG. 13 illustrates timing charts showing signal wave forms in the semiconductor integrated circuit shown in FIG. 12.

FIG. 13 illustrates timing charts showing signal wave forms in the circuit of FIG. 12: (a), (b), and (c) denote signal changes of the signals SA3, SB3, and SC3, respectively; (d) and (e) denote signal changes of the node CP1 and node CP2, respectively; and (f) denotes a potential change of the p-well in the memory cell region of the substrate 10. Note that the internal control signal SB3 maintains H level at the terminal D till a current flowing from the node CP2 to GND exceeds a certain threshold value.

The operation will be next described.

When the external control signal SA3 changes from H level to L level at the trailing edge of a time t31, a test mode for remedying CP contact failures begins. Next, when the internal control signal SB3 is in a state of H level (T period of time), the internal control signal SC3 also changes from H level to L level. Thus, the node CP1 changes from Vcp to Vxx via the switching circuit 60 of FIG. 6, while the node CP2 changes from Vcp to GND via the switching circuit 70 of FIG. 7, resulting in applying the overvoltages Vxx and Vcp alternately between the node CP1 and node CP2. These overvoltages enables to break the insulation of the parasitic capacitors C1 and C2 which had been generated in the CP contact in failed portions as shown in FIG. 5, effecting a desired ohmic characteristic for the CP contact.

On the other hand, the p-well changes from Vbb of the substrate bias to Vxx/2 at the time t31, and thereafter when the CP contact comes to be normal, a voltage applied between the cell plate (CP) and the storage node (SN) is reduced. Consequently, the dielectric film 53 between the storage nodes 28a, 28b and the cell plate 29 may be prevented from the breakdown, which could be caused by applying excessively the overvoltage.

When the parasitic capacitors C1 and C2 are subjected to the breakdown, a current Ia flows in the transistor 16a of FIG. 12 connected to the node CP2, and a current flows from the main power supply (Vcc) to the load 16c in the current mirror circuit of the current limitation circuit 161. Accordingly, the size ratio between the transistors 16a, 16b, and the resistance value of the load 16c are appropriately adjusted, which enables to perform a setting so that the output E of the current limitation circuit 161 can change from H level to L level when the current value exceeds a desired threshold value.

In response to this, the terminal C of the control circuit 40 changes from L level to H level, and the nodes CP1 and CP2 change to Vcp, while the p-well changes to Vbb (time t32). The overvoltage applied between the nodes CP1 and CP2 stops and limits the current, thereby protecting from the breakdown of the capacitor dielectric film 53 due to unnecessary current feedings.

In the aforementioned operations, after the internal control signal SB3 changes from L level to H level, the internal control signal SC3 is maintained in H level even if the external control signal SA3 is L level, and thereby the overvoltage is never applied between the nodes CP1 and CP2.

Figures 14A, 14B:
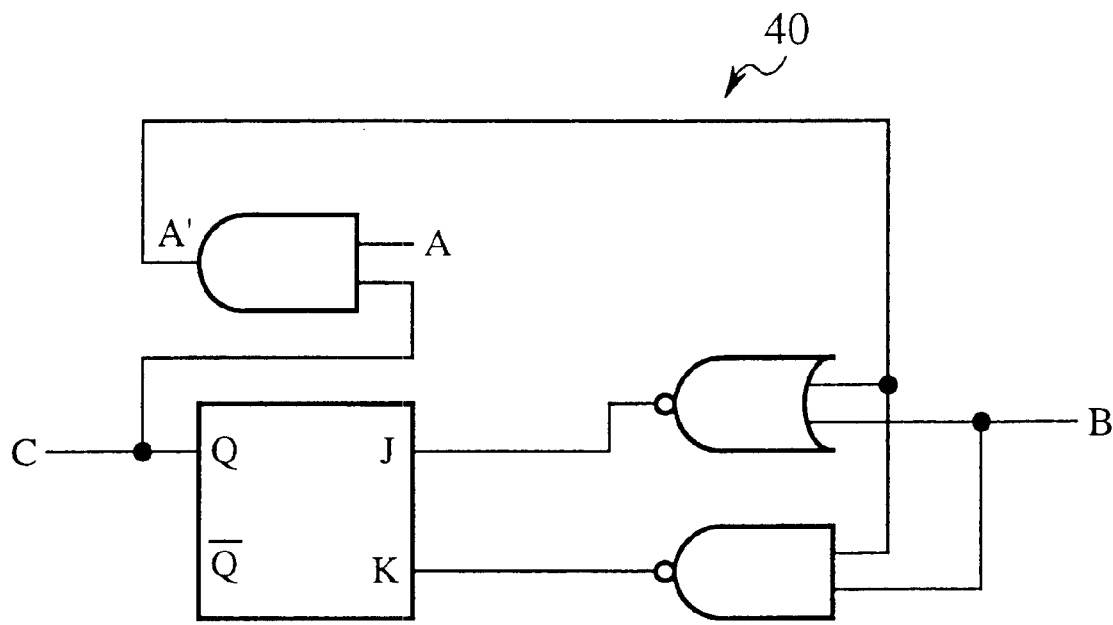
FIGS. 14A and 14B illustrate a specific example and a state transition table of a control circuit, respectively.
Figure 15:
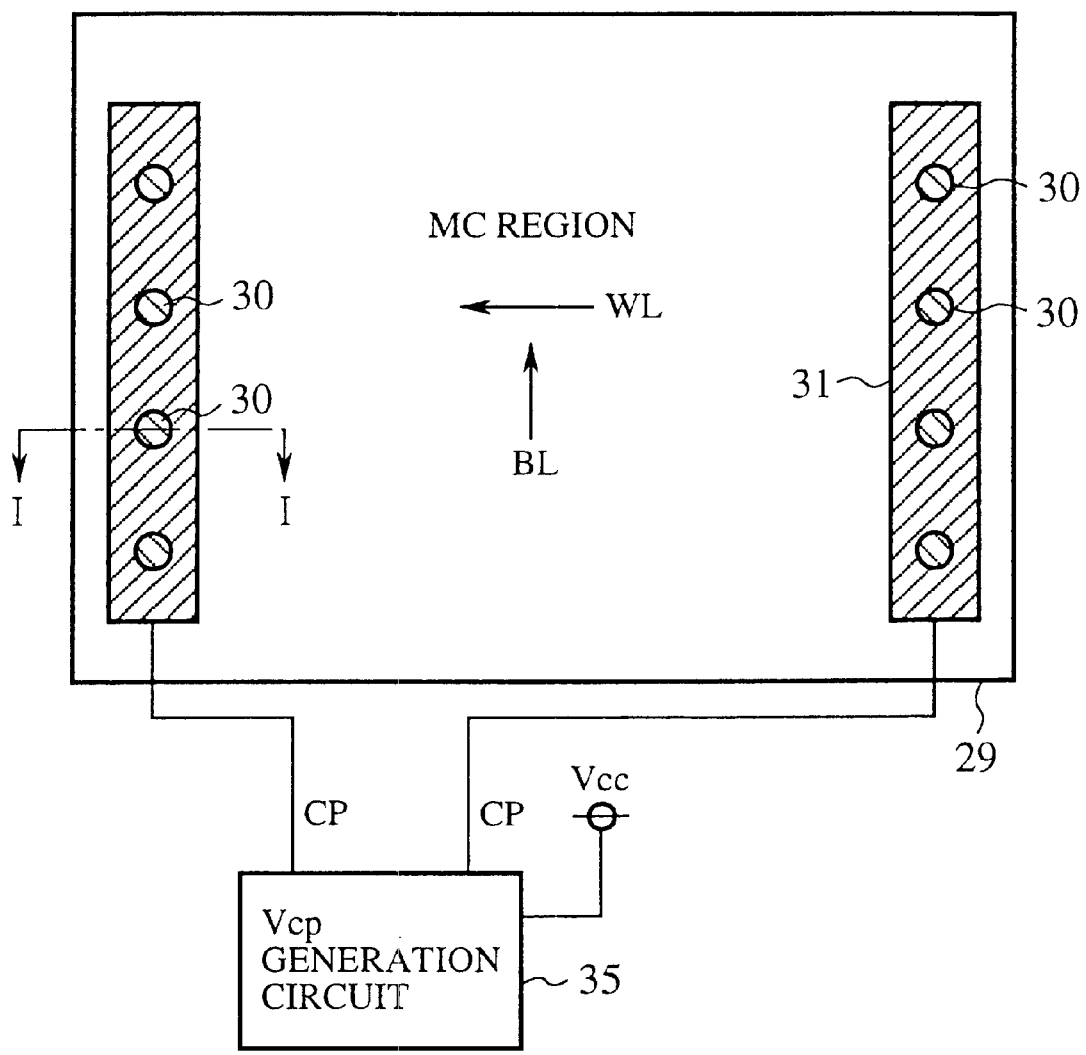
FIG. 15 is a layout schematic diagram of a conventional semiconductor integrated circuit.
Figure 16:
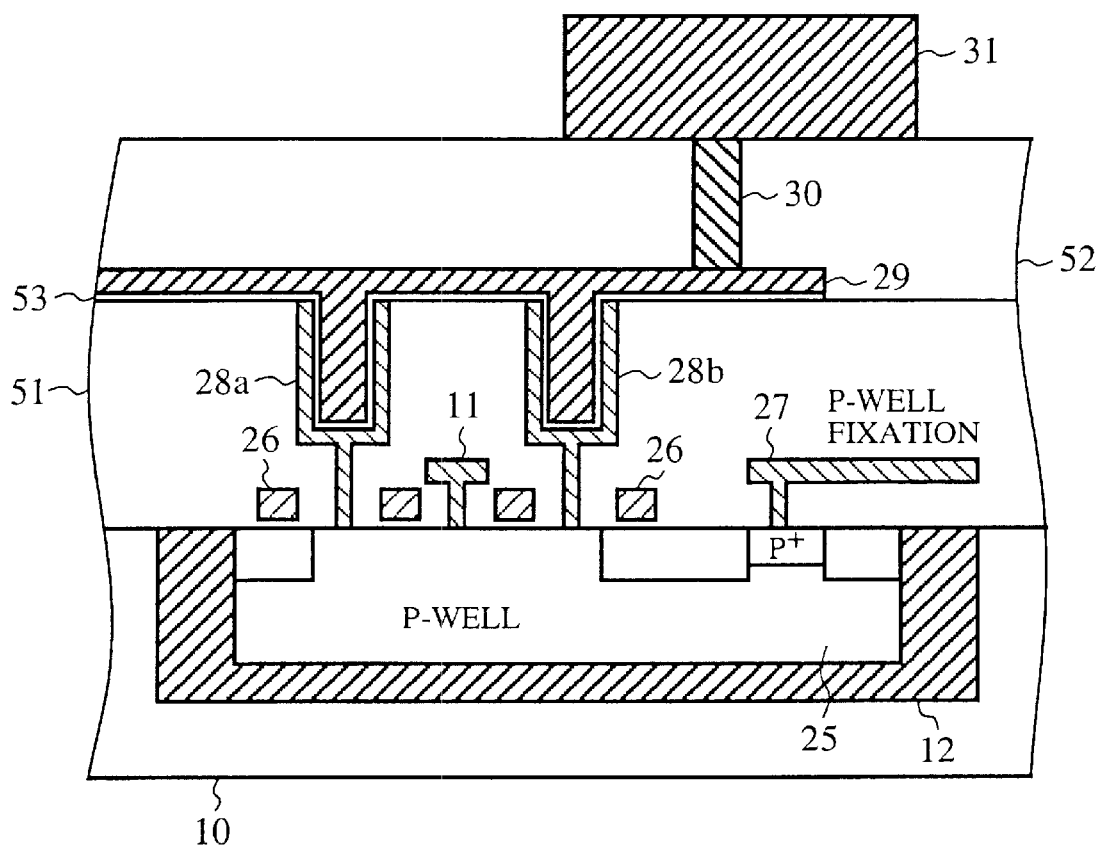
FIG. 16 is a schematic cross-section taken along a I—I line on a real device configuration having the circuit of FIG. 15.

FIGS. 14A and 14B illustrate a specific example and a state transition table of the control circuit 40, respectively. Note that the external control signal SA3 is inputted to the terminal A of FIG. 14A.

As described above, according to the embodiment 3, after the CP contact failure is remedied upon the test mode of the signal SA3, it may be prevented that inadvertent overvoltages Vxx and GND are repeatedly applied to the nodes CP2 and CP2, respectively. In addition, the overvoltage is not applied again to the CP contact failed portions which are once normalized, thus minimizing component breakage due to the breakdown of the dielectric film 53 of the capacitor, and performing the remedy of defective chips with more reliability.

What is claimed is:

1. A semiconductor integrated circuit comprising:
   a semiconductor substrate;
   a memory cell including a field effect transistor formed in said semiconductor substrate, and a capacitor having a storage node connected to the source and a cell plate formed on said storage node via a dielectric film;
   a first wiring including said cell plate;
   a first power supply for feeding a first potential so as to maintain a predetermined potential in said cell plate of said capacitor;

a second wiring having a first node and a second node connected to said first power supply;

a first contact connected to said first wiring;

a second contact connected to said first and second nodes;

a logic circuit which may input a control signal externally at its first input and which connects said first node to its second input;

a first switching circuit for selecting said first power supply or a second power supply for feeding a second potential, which is higher than a first potential of said first power supply, in response to an output after calculation in said logic circuit, to feed either of said first and second potentials to said first node;

a second switching circuit for selecting said first power supply or a third power supply for feeding a third potential, which is lower than the first potential of said first power supply, in response to the output after calculation in said logic circuit to feed either of said first and third potentials to said second node; and a third switching circuit for selecting a fourth power supply for feeding a fourth potential lower than said third potential, or a fifth power supply for feeding a fifth potential, which is higher than said fourth potential and lower than said second potential, in response to the output after calculation in said logic circuit to feed either of said fourth and fifth potentials to said semiconductor substrate associated with said memory cell.

2. The semiconductor integrated circuit according to claim 1, wherein said second and third potentials are alternately applied to the first and second nodes of said second wiring.

3. The semiconductor integrated circuit according to claim 1, wherein a current limitation circuit is connected to a wiring on the side of a third power supply of said second switching circuit, and an output from said current limitation circuit is connected to the second input of said logic circuit.

4. The semiconductor integrated circuit according to claim 3, wherein said current limitation circuit includes a current mirror circuit and based on a wiring potential on the side of said third power supply of said second switching circuit, a main power supply for feeding a power supply potential or said third power supply for feeding said third potential is selected to feed either of said power supply potential and said third potential to the second input of said logic circuit.

5. The semiconductor integrated circuit according to claim 4, wherein a load is connected to a wiring on the side of said main power supply, and said power supply potential is fed to the second input of said logic circuit via said load.

6. The semiconductor integrated circuit according to claim 3, wherein said logic circuit serves as a control circuit for limiting said second and third potentials which is fed to said cell plate constituting said capacitor in response to a control signal.

7. A semiconductor integrated circuit having a multi level interconnect structure comprising:

a first wiring connected to a transistor region formed in a semiconductor substrate;

an interlayer dielectric formed on top of this topography;

first and second contacts formed in said interlayer dielectric;

a second wiring formed on top of said interlayer dielectric and connected electrically to said first wiring via said first and second contacts; and switching means, connected to said first and second wirings respectively, for feeding a high potential and a low potential alternatively to said first and second contacts.

8. The semiconductor integrated circuit according to claim 7, wherein said switching means is connected to a transistor region of said semiconductor substrate, and feeds said high and low potentials alternately.

* * * * *